(12) United States Patent
Dimitriu

(10) Patent No.: US 7,965,105 B2
(45) Date of Patent: Jun. 21, 2011

(54) INPUT BUFFER WITH OPTIMAL BIASING AND METHOD THEREOF

(75) Inventor: Dragos Dimitriu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/787,131

(22) Filed: May 25, 2010

(65) Prior Publication Data
US 2010/0231300 A1 Sep. 16, 2010

Related U.S. Application Data

(63) Continuation of application No. 12/211,445, filed on Sep. 16, 2008, now Pat. No. 7,737,729, which is a continuation of application No. 11/347,477, filed on Feb. 3, 2006, now Pat. No. 7,425,847.

(51) Int. Cl.
 H03K 19/094 (2006.01)
 H03K 19/0175 (2006.01)
(52) U.S. Cl. ............... 326/86; 326/82; 326/127
(58) Field of Classification Search ............ None
 See application file for complete search history.

(56) References Cited

U.S. PATENT DOCUMENTS

| 4,571,554 A | 2/1986 | Martin et al. |
| 4,958,133 A | 9/1990 | Bazes |
| 6,081,162 A * | 6/2000 | Johnson ............ 330/301 |
| 6,486,713 B2 | 11/2002 | Wright et al. |
| 6,806,743 B2 | 10/2004 | Saito et al. |
| 6,940,328 B2 | 9/2005 | Lin |
| 7,053,712 B2 | 5/2006 | Bonaccio et al. |
| 7,098,699 B2 | 8/2006 | Tamura et al. |
| 7,164,615 B2 | 1/2007 | Park et al. |
| 7,310,018 B2 | 12/2007 | Staples et al. |
| 7,372,331 B2 * | 5/2008 | Menczigar et al. ....... 330/261 |
| 7,425,847 B2 * | 9/2008 | Dimitriu ............... 326/86 |
| 2002/0011877 A1 | 1/2002 | Lim |
| 2005/0151588 A1 | 7/2005 | Bailey et al. |
| 2005/0243644 A1 | 11/2005 | Taruishi et al. |
| 2005/0285629 A1 | 12/2005 | Hein et al. |
| 2006/0066393 A1 | 3/2006 | Davis et al. |
| 2008/0061825 A1 * | 3/2008 | Hsu et al. ............. 326/68 |

FOREIGN PATENT DOCUMENTS

JP 07307625 11/1995

* cited by examiner

*Primary Examiner* — Anh Q Tran
(74) *Attorney, Agent, or Firm* — TraskBritt

(57) ABSTRACT

A method and circuit of a biased input buffer is described to maximize the quality in the output signals. The input buffer includes a first stage for receiving differential input signals and generating differential internal signals as biased in response to an averaging of the differential internal signals. The input buffer further includes a second stage coupled to the differential internal signals and configured to generate differential output signals. A memory device includes a memory array with the respective input buffer. Differential input signals are received and differential internal signals are generated as biased in response to an averaging of the differential internal signals. Differential output signals are generated in a second stage from the differential internal signals.

25 Claims, 5 Drawing Sheets

US 7,965,105 B2

INPUT BUFFER WITH OPTIMAL BIASING AND METHOD THEREOF

CROSS-REFERENCE TO RELATED APPLICATIONS

This application is a continuation of U.S. patent application Ser. No. 12/211,445, filed Sep. 16, 2008, now U.S. Pat. No. 7,737,729, issued Jun. 15, 2010, which is a continuation of U.S. patent application Ser. No. 11/347,477, filed Feb. 3, 2006, now U.S. Pat. No. 7,425,847, issued Sep. 16, 2008, the disclosures of each of which are incorporated herein by this reference in their entirety. This application is also related to U.S. patent application Ser. No. 11/208,858, filed Aug. 23, 2005, now U.S. Pat. No. 7,310,018, issued Dec. 18, 2007, and to U.S. patent application Ser. No. 11/979,327, filed Nov. 1, 2007, now U.S. Pat. No. 7,449,953, issued Nov. 11, 2008.

BACKGROUND OF THE INVENTION

1. Field of the Invention

The present invention relates to input buffers and, more particularly, to input buffers with biasing to minimize the effect of common mode variation of signals and maximize output gain.

2. State of the Art

Input buffers are typically optimized for speed around small input voltage ranges that are susceptible to contamination by noise. Accordingly, removal of noise from the input signals is desirable for improved isolation of the desired signal. Input buffers that include differential inputs may be used to transmit signals over relatively large distances with minimal signal degradation due to interference from external sources (i.e., noise or other interference). The resulting differential output signals from a conventional input buffer exhibit both an original logic signal and a complementary logic signal of the original input signal. Common Mode Variation (CMV) manifests as equal changes of both signals in a differential transmission. CMVs may be caused by many things including noise, power supply or reference voltage differences. Therefore, differential input buffers should offer the best possible rejection of CMV in order to recreate a signal that more closely approximates the original input signal.

One common problem associated with input buffers that generate differential output signals is ensuring a desirably balanced output signal. FIG. 1A illustrates a schematic of a conventional input buffer 100 depicted as a fully differential operational amplifier. The input buffer 100 receives an input voltage $V_{in+}$ at a positive terminal and a complementary input voltage $V_{in-}$ at a negative terminal. The input buffer 100 outputs differential outputs $V_{out+}$ and $V_{out-}$ based on the input voltages. When noise couples to the input signals as presented to the input buffer, the levels of the respective input signals may individually and uniquely be affected thereby creating variations in phase and magnitude on the differential output signals. For example, FIG. 1B illustrates the differential outputs $V_{out+}$ and $V_{out-}$ as generated from a conventional input buffer 100. As shown, the outputs $V_{out+}$ and $V_{out-}$ are not balanced. Specifically, the output signal $V_{out-}$ should be the substantial inverse of $V_{out+}$ such that the crossing points 150 of the two output signals $V_{out+}$ and $V_{out-}$ in combination would result in a signal of substantially 0 volts. Many factors, including process variations, may also cause $V_{out+}$ and $V_{out-}$ to not be balanced even without noise.

FIG. 2 illustrates a circuit diagram of a conventional input buffer 200 that is driven with differential input signals $V_{in+}$ and $V_{in-}$ and generates differential output signals $V_{out+}$, $V_{out-}$. Input buffer 200 includes a first stage circuit 280 and a second stage circuit 290. In a conventional input buffer, the circuit is self-biased to reduce the affects of CMV on the input signals. A self-biased input buffer may have relatively small CMV sensitivity when implemented in a traditional long channel process. However, for MOS devices in modern processes, the threshold voltages represent a larger portion of the circuit operating voltage and the CMV sensitivity of such an implementation may become significant.

As illustrated, the first stage circuit 280 includes a first input transistor 201 for receiving the input signal $V_{in+}$ at a gate terminal 201', a second input transistor 202 for receiving the input signal $V_{in-}$ at a gate terminal 202', first and second bias transistors 203, 204 having associated gates 203', 204', and third and fourth load transistors 207, 208 with associated gates 207', 208'.

The gates 203', 204' of the first and second bias transistors 203, 204 are electrically connected to each other and the gates 207', 208' of the third and fourth load transistors 207, 208 are electrically connected to each other. Also, a drain terminal of each of the third and fourth load transistors 207, 208 is respectively electrically connected to a drain terminal of each of the first and second input transistors 201, 202. The first stage circuit 280 further includes an output node 209 at which positive output $V_{out+}$ is generated. The output node 209 is electrically connected to the drain terminal of the fourth load transistor 208 and to the drain terminal of the second input transistor 202. In addition, first stage circuit 280 includes connecting the drain of third load transistor 207, gates 207', 208' of third and fourth load transistors 207, 208 with the gates 203', 204' of first and second bias transistors 203, 204 at the node 220 to form the self-biasing characteristic of the input buffer 200.

The second stage circuit 290 includes a third input transistor 250 for receiving the output voltage $V_{out+}$ at a gate terminal 250', fifth and sixth bias transistors 252, 253 having associated gates 252', 253' and seventh and eighth load transistors 254, 255 with associated gates 254', 255'. The gates 252', 253' of the fifth and sixth bias transistors 252, 253 are electrically connected to each other and the gates 254', 255' of the seventh and eighth load transistors 254, 255 are electrically connected to each other. Also, a drain terminal of the seventh load transistor 254 is electrically connected to a drain terminal of the third input transistor 250, and separately a drain terminal of the eighth load transistor 255 is electrically connected to a drain terminal of the sixth bias transistor 253.

The second stage circuit 290 further includes an output node 256 at which output $V_{out-}$ is generated. In addition, second stage circuit 290 is also self-biased by connecting the drain of the seventh load transistor 254, the gates 254', 255' of the seventh and eighth load transistors 254, 255 with the gates 252', 253' of fifth and sixth bias transistors 252, 253 at the node 260.

The configuration of the conventional input buffer generates unbalanced positive and negative output signals, such as that illustrated in FIG. 1B. Furthermore, manufacturing process variations result in variations to the transistor switching points thereby injecting further variations in the alignment and propagation of the output signals. Accordingly, there is a desire for an input buffer that generates a better balanced differential output.

BRIEF SUMMARY OF THE INVENTION

The various embodiments of the present invention provide a circuit and method for biasing an input buffer to maximize the quality in the output signals. In one embodiment of the present invention, an input buffer is provided. The input buffer includes a first stage for receiving differential input signals and generating differential internal signals wherein the first stage is optimally biased in response to an averaging of the differential internal signals. The input buffer further includes a second stage coupled to the differential internal signals and configured to generate differential output signals.

In another embodiment of the present invention, a memory device is provided. The memory device includes a memory array including a plurality of memory cells. The memory device further includes an input buffer including a first stage for receiving differential input signals and for generating differential internal signals biased in response to an averaging of the differential internal signals. The input buffer further includes a second stage coupled to the differential internal signals and configured to generate differential output signals.

In a further embodiment of the present invention, an electronic system is provided. The electronic system includes a processor and a memory device operatively coupled to the processor. The memory device includes a memory array including a plurality of memory cells and an input buffer. The input buffer includes a first stage for receiving differential input signals and generating differential internal signals biased in response to an averaging of the differential internal signals and a second stage coupled to the differential internal signals and configured to generate differential output signals.

In yet another embodiment of the present invention, a method for buffering an input signal is provided. At a first stage, differential input signals are received and differential internal signals are generated biased in response to an averaging of the differential internal signals. Differential output signals are generated in a second stage from the differential internal signals.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Figure 1A:
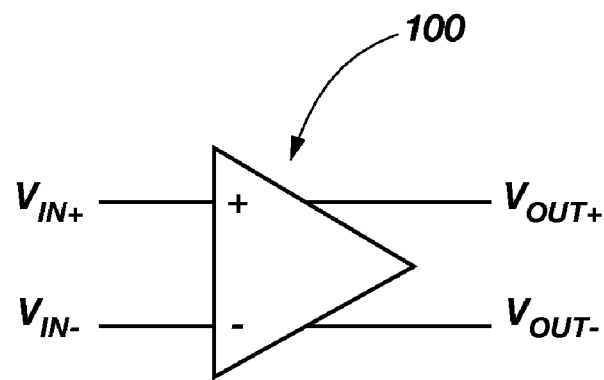
FIG. 1A is a schematic of an input buffer, in accordance with the prior art.
Figure 1B:
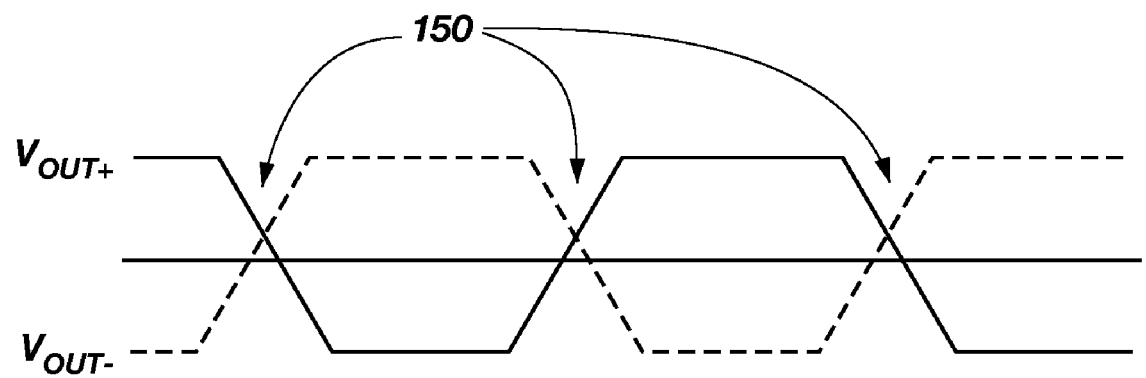
FIG. 1B is plot of differential output signals of an input buffer, in accordance with the prior art.
Figure 2:
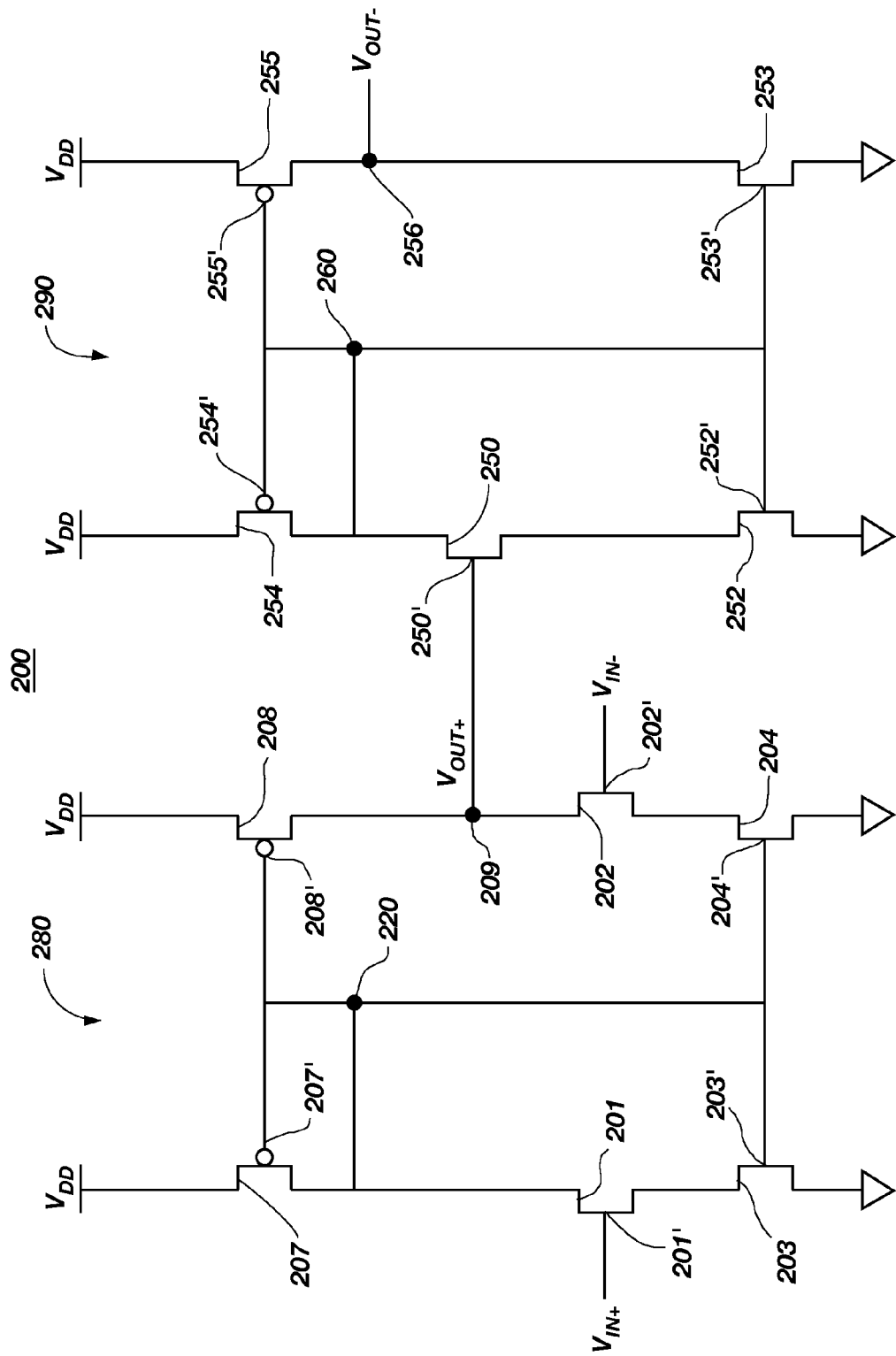
FIG. 2 is a circuit diagram of an input buffer, in accordance with the prior art.
Figure 3:
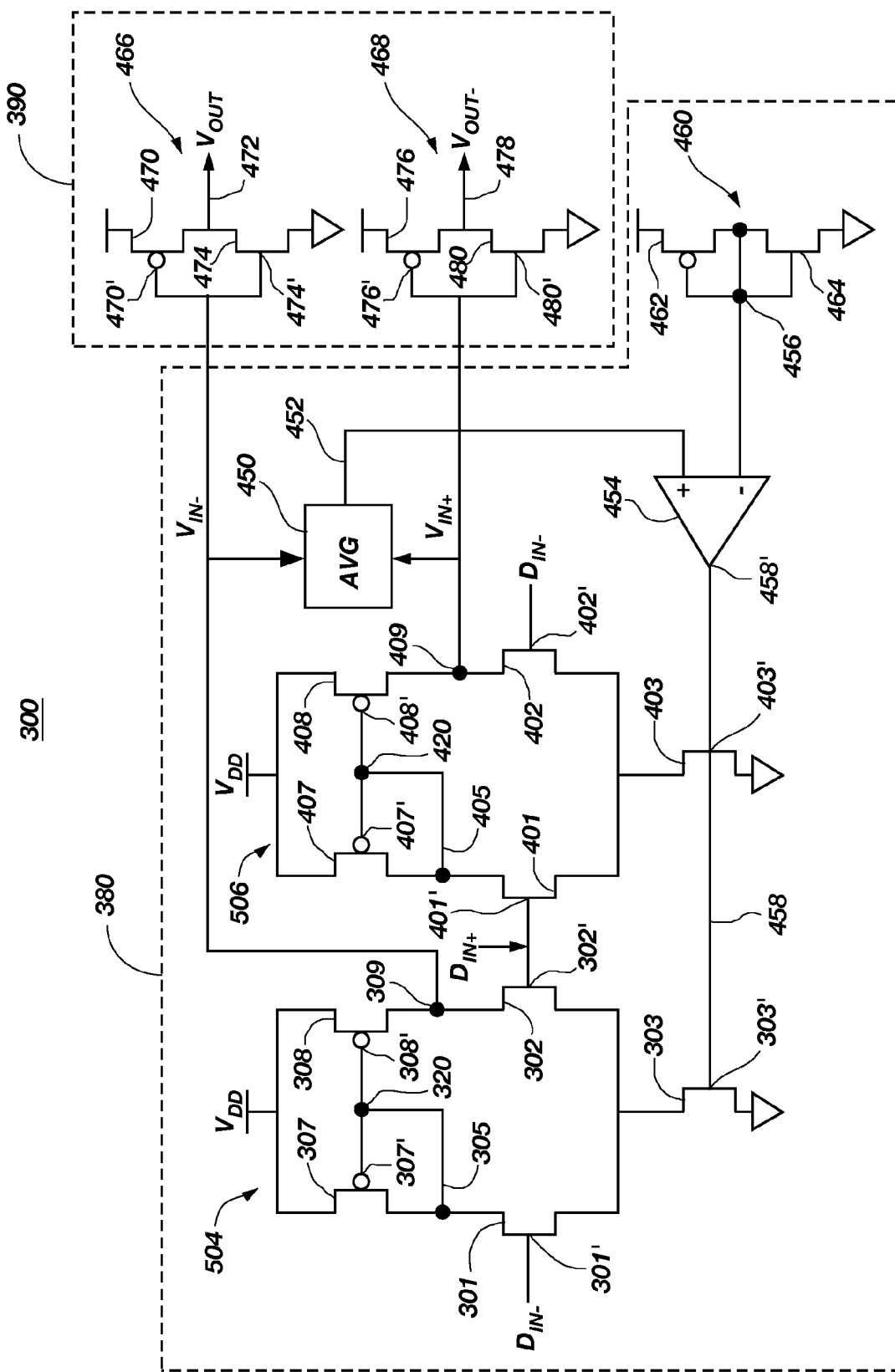
FIG. 3 is a circuit diagram of an input buffer, in accordance with an embodiment of the present invention.

FIG. 3 illustrates a circuit diagram of an input buffer 300, in accordance with an embodiment of the present invention. An input buffer 300 includes a first stage circuit 380 and a second stage circuit 390. The first stage circuit 380 is configured to generate and apply an improved and even optimal bias voltage that controls the outputs of the first stage circuit 380 to have a common mode that is matched to a switching point of the second stage circuit 390. Furthermore, outputs of the first stage circuit 380 are further configured to remain matched to the switching point of the second stage circuit 390 in the presence of input common mode variations and PN process shifts in the manufacture of the input buffer 300.

The first stage circuit 380 includes a first differential circuit 504 and a second differential circuit 506. The first differential circuit 504 includes a first input transistor 301 for receiving an input signal $D_{in-}$ at a gate terminal 301', a second input transistor 302 for receiving an input signal $D_{in+}$ at a gate terminal 302', a first bias transistor 303 having an associated gate 303', wherein a drain terminal of the first bias transistor 303 is electrically connected to a source terminal of the first input transistor 301 and to a source terminal of the second input transistor 302, and the source terminal of the first bias transistor 303 is electrically connected to electrical ground or negative power source $V_{SS}$.

Generally, the first differential circuit 504 of the first stage circuit 380 has a PMOS current mirror load formed by first and second mirror load transistors 307, 308. The gates 307', 308' of first and second mirror load transistors 307, 308 are electrically connected at a connection node 320 via a shunt node 305 to the drain of the first input transistor 301. The drain of second mirror load transistor 308 is connected to the drain of the second input transistor 302 at output node 309. The first differential internal signal $V_{in-}$ is generated at output node 309. The source terminal of the first minor load transistor 307 and the source terminal of the second mirror load transistor 308 are electrically coupled to a power source $V_{DD}$.

As stated, the first stage circuit 380 includes a second differential circuit 506 for generating a complementary second differential internal signal $V_{in+}$. The second differential circuit 506 includes a third input transistor 401 for receiving the input signal $D_{in+}$ at a gate terminal 401', a fourth input transistor 402 for receiving the input signal $D_{in-}$ at a gate terminal 402', a second bias transistor 403 having an associated gate 403', wherein a drain terminal of the second bias transistor 403 is electrically connected to a source terminal of the third input transistor 401 and to a source terminal of the fourth input transistor 402, and the source terminal of the second bias transistor 403 is electrically connected to electrical ground or $V_{SS}$.

Generally, the second differential circuit 506 of the first stage circuit 380 has a PMOS current mirror load formed by third and fourth mirror load transistors 407, 408 for generating a second differential internal signal $V_{in+}$. A source terminal of the third mirror load transistor 407 and a source terminal of the fourth mirror load transistor 408 are electrically coupled to a power source $V_{DD}$. A drain terminal of the third mirror load transistor 407 electrically connects to the drain terminal of the third input transistor 401 which is further electrically connected to a third connection node 420. Similarly, a drain terminal of the fourth mirror load transistor 408 electrically connects to the drain terminal of the fourth input transistor 402, which is further electrically connected to an output node 409. A drain terminal of the third mirror load transistor 407 is respectively electrically connected to a shunt circuit 405. The second differential internal signal $V_{in+}$ is generated at the output node 409. Second differential circuit 506 of first stage circuit 380 further includes the third connection node 420 respectively connected between the gates 407', 408' of third and fourth mirror load transistors 407, 408, and the shunt node 405. The shunt node 405 further electrically connects with the drain terminal of third input transistor 401.

It is noted that first and second differential circuits 504, 506 are driven by the same input signals $D_{in+}$, $D_{in-}$. Specifically, $D_{in+}$ drives the gates 302', 401' of the input transistors 302, 401 with the drain of second input transistor 302 further connected to output node 309 having the signal $V_{in-}$ thereon. Similarly, $D_{in-}$ drives the gates 301', 402' of the input transistors 301, 402 with the drain of input transistor 402 further connected to output node 409 having the signal $V_{in+}$ thereon.

The first stage circuit 380 further includes an averaging circuit 450 having inputs coupled to the first differential internal signal $V_{in-}$ as generated at the output node 309 and the second differential internal signal $V_{in+}$ as generated at the output node 409. The averaging circuit 450 generates an averaged output signal 452 resulting from the averaging of instantaneous voltages of the first differential internal signal $V_{in-}$ and the second differential internal signal $V_{in+}$.

The first stage circuit 380 further includes a comparator circuit 454 having comparative inputs, one non-inverting comparative input of which is coupled to the averaged output signal 452. The comparator circuit 454 further includes another inverting comparative input coupled to a reference signal node 456. The comparator circuit 454 generates a bias signal 458 at a comparator circuit output 458' which is used as a bias signal to drive the gates 303', 403' of the respective first and second common mode feedback transistors 303, 403 and closes the common mode feedback loop for the first stage 380.

The reference signal on the reference signal node 456, in one embodiment of the present invention, is generated by a reference shorted inverter circuit 460. The reference inverter circuit 460 includes a first PMOS transistor 462 including a source terminal electrically coupled to a power source $V_{DD}$ and a drain terminal and a gate terminal electrically coupled together. The drain terminal and gate terminal electrically couple to the reference signal node 456. The reference signal inverter circuit 460 further includes a second NMOS transistor 464 including a source terminal electrically coupled to ground and a drain terminal and a gate terminal electrically coupled together. The drain terminal and gate terminal electrically couple to the reference signal node 456.

The second stage circuit 390 includes a first output inverter 466 and a second output inverter 468 configured to respectively electrically couple to the first differential internal signal $V_{in-}$ as generated at the output node 309 and the second differential internal signal $V_{in+}$ as generated at the output node 409. The first output inverter 466 includes a first PMOS transistor 470 including a source terminal electrically coupled to a power source $V_{DD}$ and a gate terminal 470'. The first PMOS transistor 470 further includes a drain terminal electrically coupled to an output signal node 472 configured to output the $V_{out+}$ signal from the input buffer 300. The first output inverter 466 further includes a second NMOS transistor 474 including a source terminal electrically coupled to ground and a gate terminal 474'. The second NMOS transistor 474 further includes a drain terminal electrically coupled to the output signal node 472 configured to output the $V_{out+}$ signal from the input buffer 300. The gate terminals 470', 474' are electrically coupled together and are further electrically coupled to the first differential internal signal $V_{in-}$ as generated at the output node 309.

The second output inverter 468 includes a first PMOS transistor 476 including a source terminal electrically coupled to a power source $V_{DD}$ and a gate terminal 476'. The first PMOS transistor 476 further includes a drain terminal electrically coupled to an output signal node 478 configured to output the $V_{out-}$ signal from the input buffer 300. The second output inverter 468 further includes a second NMOS transistor 480 including a source terminal electrically coupled to ground and a gate terminal 480'. The second NMOS transistor 480 further includes a drain terminal electrically coupled to the output signal node 478 configured to output the $V_{out-}$ signal from the input buffer 300. The gate terminals 476', 480' are electrically coupled together and are further electrically coupled to the second differential internal signal $V_{in+}$ as generated at the output node 409.

Figure 4:
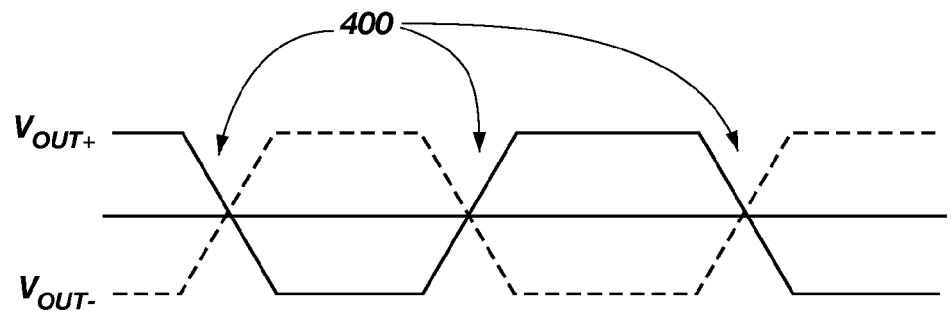
FIG. 4 is a plot of differential output signals of an input buffer, in accordance with an embodiment of the present invention.

FIG. 4 illustrates the optimized differential output voltages $V_{out+}$ and $V_{out-}$ generated by input buffer 300 of FIG. 3. $V_{out-}$ is the inverse of $V_{out+}$, such that the crossing points 400 of the two output signals $V_{out+}$, $V_{out-}$ occur where the voltages are near $V_{DD}/2$ and the output signals $V_{out+}$, $V_{out-}$ would be equal.

Hence, the various embodiments of the present invention describe an input buffer including a first stage for receiving differential input signals and generating the first differential internal signal $V_{in-}$ as generated at the output node 309 and the second differential internal signal $V_{in+}$ as generated at the output node 409. The first differential circuit 504 and the second differential circuit 506 are each oppositely electrically connected to receive the input signal $D_{in-}$ and the input signal $D_{in+}$. Alternatively, a fixed reference signal $V_{ref}$ may be substituted for one of the input signals $D_{in}$ since the first and second differential circuits 504, 506 are symmetrically configured.

The first differential internal signal $V_{in-}$ and the second differential internal signal $V_{in+}$ are averaged by the averaging circuit 450. The averaging circuit 450 generates an averaged output signal 452 resulting from the averaging of the first differential internal signal $V_{in-}$ and the second differential internal signal $V_{in+}$. The averaged output signal 452 is compared to the reference signal on the reference signal node 456 corresponding to the switching point of the reference inverter circuit 460.

The switching points of the first and second output inverters 466, 468 more closely approximates the switching point of the reference inverter circuit 460 when the inverter circuit 460, and the first and second output inverters 466, 468 are subjected to similar process variations during manufacture. Additionally, sizing the first and second output inverters 466, 468 and the inverter circuit 460 to be of similar or substantially similar sizes may also assist in matching the switching points of the inverter circuit 460 with the switching points of the first and second output inverters 466, 468. Forming the inverter circuit 460 and the first and second output inverters 466, 468 in close proximity on a substrate will further assist in matching the switching points of the inverter circuit 460 with the switching points of the first and second output inverters 466, 468. The present closed loop topology of the various embodiments of the present invention allows the first and second output inverters 466, 468 (FIG. 3) of the second stage circuit 390 to operate around their intrinsic switching points which maximizes the gain in the second stage circuit 390 regardless of input signal common mode levels or process variations.

The input buffer 300 is typically referred to as having an NMOS type first stage because first and second differential circuits 504, 506 are of NMOS type. A first stage of NMOS type has an input common range of half the operating voltage from $V_{DD}/2$ to $V_{DD}$. A PMOS type first stage may be built for the input buffer 300 by replicating PMOS with NMOS and NMOS with PMOS devices in first and second differential circuits 504, 506. If proper sizing is maintained, a PMOS type first stage will have an input common mode range from 0 to $V_{DD}/2$. Therefore, for full voltage range operation (i.e., 0 to $V_{DD}$), both NMOS and PMOS type first stage circuits must be present in the input buffer. The implementation of complementary circuits is understood by those of ordinary skill in the art and is not further discussed herein.

Figure 5:
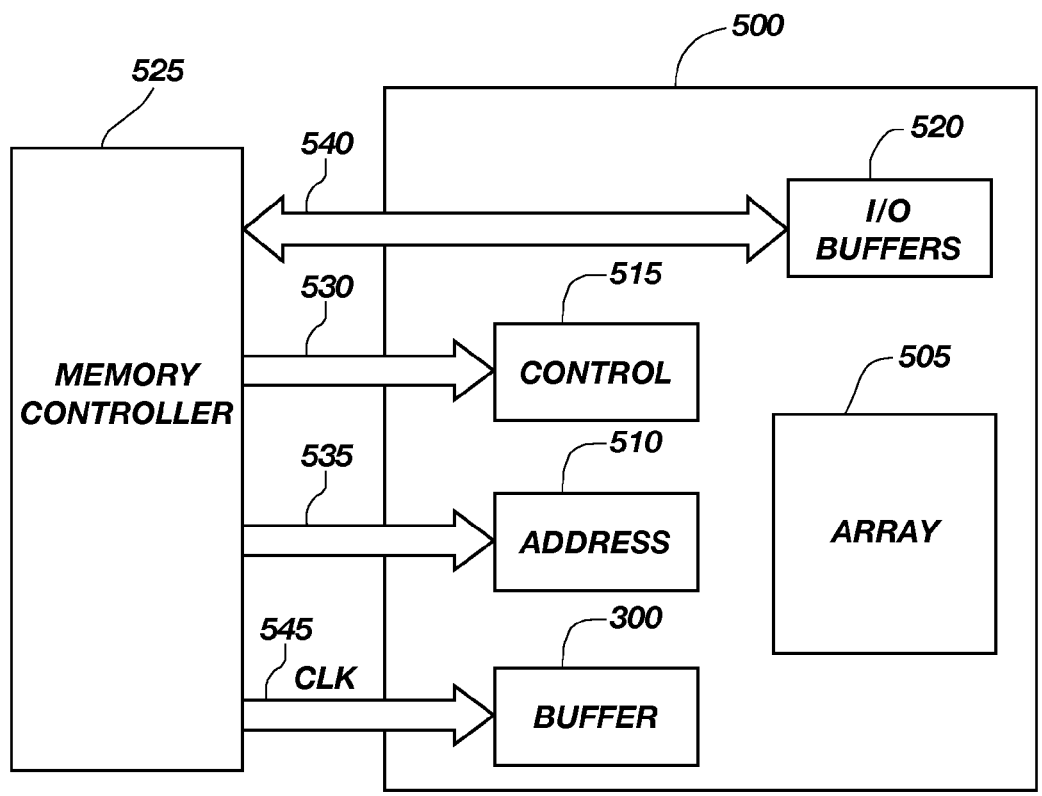
FIG. 5 is a block diagram of a memory device including an input buffer, in accordance with an embodiment of the present invention.

The above-described input buffer generating differential output signals is particularly useful in to integrated circuits, an example of which may be an integrated circuit memory device. In particular, the input buffer is useful in synchronous memory devices such as a synchronous dynamic random access memory (SDRAM). A simplified block diagram of a memory device 500 is illustrated in FIG. 5. The memory device 500 includes an array of memory cells 505, address circuitry 510 for latching and addressing the memory array 505, a differential input buffer 300 for receiving a clock signal (CLK) 545, data signal, and/or control signals for coupling with other circuitry 510, 515 for addressing and/or controlling the operation of the memory device 500 and/or for providing input/output (I/O) buffering of data. The differential input buffer 300 includes the circuitry described above with respect to FIG. 3 for reducing clock skew. An external memory controller 525 is typically used to provide control signals on lines 530, address signals on lines 535, and transmit and receive data on lines 540. It will be appreciated by those skilled in the art that the memory device of FIG. 5 is simplified to illustrate the present invention and is not intended to be a detailed description of all of the features of a memory device. It should also be understood that while a single memory device is shown in FIG. 5, that in practice there will be a plurality of memory devices connected to memory controller 525 and that one or more memory devices may be contained on a memory module. In addition to clock signals, the invention may be used for address signals, data signals, command signals, and other signals where generating a balanced differential output would be beneficial. Additionally, while the input buffer is illustrated as finding application in a memory device, the input buffer also finds general application to other electronic devices and circuits where common mode signal rejection is advantageous.

Figure 6:
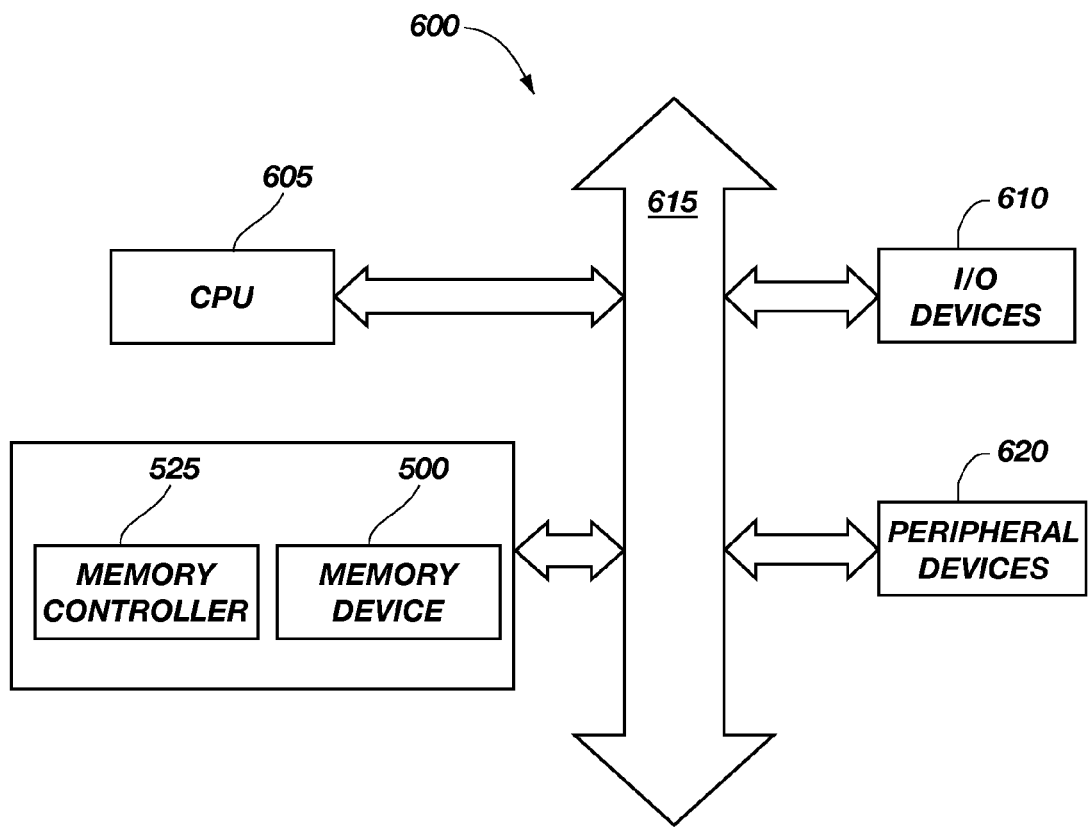
FIG. 6 is block diagram of an electronic system including an input buffer, in accordance with an embodiment of the present invention.

FIG. 6 illustrates a typical electronic system 600 which includes a memory device 500, having an input buffer 300 (see FIG. 5) constructed in accordance with an exemplary embodiment of the present invention. The electronic system 600 may further include the memory device 500 and memory controller 525 as shown in FIG. 5. An electronic system 600, such as a computer system, generally comprises a central processing unit (CPU) 605, such as a microprocessor, a digital signal processor, or other programmable digital logic devices, which communicates with one or more input/output (I/O) devices 610 over a bus 615. The memory device 500 communicates with the CPU 605 over bus 615 typically through a memory controller.

In the case of a computer system, the electronic system may include peripheral devices 620, such as a floppy disk drive or a compact disc (CD) ROM drive, which also communicate with CPU 605 over the bus 615. Memory device 500 is preferably constructed as an integrated circuit, which includes one or more input buffers, e.g., input buffer 300. If desired, the memory device 500 may be combined with the processor, for example CPU 605, in a single integrated circuit.

Figure 7:
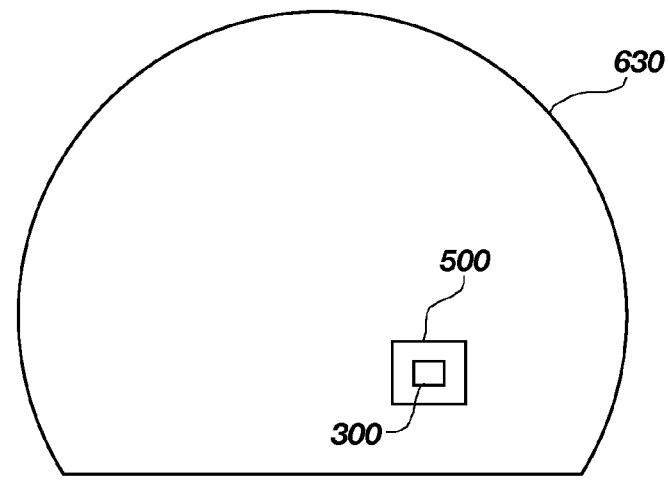
FIG. 7 is a diagram of a semiconductor wafer on which an input buffer in accordance with an embodiment of the present invention may be formed.

As shown in FIG. 7, the input buffer 300 may be included in one or more types of devices, an example of which is memory device 500, and may be fabricated on the surface of a semiconductor wafer 630. The semiconductor wafer 630 may be made from silicon, gallium-arsenide, or other similarly accommodating materials. It should also be understood that the input buffer 300 and device, such as memory device 500, may be fabricated on semiconductor substrates other than a wafer, such as a Silicon-on-Insulator (SOI) substrate, a Silicon-on-Glass (SOG) substrate, and a Silicon-on-Sapphire (SOS) substrate.

The processes and devices described above illustrate currently preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the invention is discussed only with reference to input buffers using p-type and n-type transistors as described, other input buffers using common mode feedback are also intended to be within the scope of the invention. Additionally, any modifications, though presently unforeseeable, of the present invention that come within the spirit and scope of the following claims should be considered part of the present invention.

What is claimed is:

1. A buffer, comprising:
   a first stage including a plurality of oppositely electrically connected differential circuits configured to receive input signals and generate differential signals; and
   a second stage operably coupled with the first stage and configured to receive the differential signals and to generate output signals in response thereto,
   wherein the second stage has a switching point and the first stage is configured such that the differential signals have a common mode that is matched to the switching point of the second stage.

2. The buffer of claim 1, wherein the first stage is configured such that the common mode remains matched to the switching point of the second stage in the presence of input common mode variations.

3. The buffer of claim 1, wherein the first stage is configured such that the common mode remains matched to the switching point of the second stage in the presence of process shifts in the manufacture of the buffer.

4. The buffer of claim 1, wherein the input signals comprise differential input signals.

5. The buffer of claim 1, wherein one of the input signals comprises a fixed reference signal.

6. The buffer of claim 1, wherein the differential signals comprise a first differential internal signal and a second differential internal signal, and wherein the first stage comprises:
   a first differential circuit of the plurality of oppositely electrically connected differential circuits having a first bias transistor, the first differential circuit being configured to receive the input signals and to generate the first differential internal signal;
   a second differential circuit of the plurality of oppositely electrically connected differential circuits having a second bias transistor, the second differential circuit being configured to receive the input signals and to generate the second differential internal signal, the first and second differential circuits each being oppositely electrically connected to receive the input signals;

an averaging circuit operably coupled with the first and second differential circuits, the averaging circuit being configured to generate an averaged signal resulting from averaging the first differential internal signal and the second differential internal signal; and a comparator operably coupled with the averaging circuit and the first and second bias transistors, the comparator being configured to compare the averaged signal to a reference signal corresponding to a switching point of the second stage, and to generate a bias signal, wherein the bias signal is used to drive the first and second bias transistors.

7. The buffer of claim 6, wherein the first differential circuit and the second differential circuit are symmetrically configured.

8. The buffer of claim 6, wherein the first differential internal signal and the second differential internal signal are complementary.

9. The buffer of claim 6, wherein the averaging circuit is further configured to generate an averaged output signal resulting from averaging instantaneous voltages of the first differential internal signal and the second differential internal signal.

10. The buffer of claim 6, wherein the first and second bias transistors comprise common mode feedback transistors.

11. The buffer of claim 6, wherein the output signals comprise a first differential output signal and a second differential output signal, the second stage comprising:
a first output inverter having a switching point, the first output inverter being configured to receive the first differential internal signal and to output the first differential output signal; and
a second output inverter having a switching point, the second output inverter being configured to receive the second differential internal signal and to output the second differential output signal.

12. The buffer of claim 11, wherein the first stage further comprises a reference shorted inverter circuit configured to generate the reference signal, and wherein the reference shorted inverter circuit has a switching point that approximates the switching points of the first output inverter and the second output inverter.

13. The buffer of claim 12, wherein the reference shorted inverter circuit and the first output inverter and the second output inverter are subjected to similar process variations during manufacture.

14. The buffer of claim 12, wherein the reference shorted inverter circuit and the first output inverter and the second output inverter are of substantially similar sizes.

15. The buffer of claim 12, wherein the reference shorted inverter circuit is formed in close proximity to the first output inverter and the second output inverter.

16. A memory device, comprising:
a plurality of memory cells; and
a buffer operably coupled with the plurality of memory cells, the buffer comprising:
a first stage including a first differential circuit oppositely electrically connected with a second differential circuit to receive the input signals, and configured to generate differential signals in response to the input signals; and
a second stage operably coupled with the first stage, the second stage configured to generate output signals in response to the differential signals,
wherein the second stage has a switching point and the first stage is configured such that the differential signals have a common mode that is matched to the switching point of the second stage.

17. The memory device of claim 16, wherein the differential signals comprise a first differential internal signal and a second differential internal signal, and wherein:
the first differential circuit is configured to generate the first differential internal signal responsive to the input signals; and
the second differential circuit is configured to generate the second differential internal signals in response to the input signals.

18. The memory device of claim 17, wherein each of the first differential circuit and the second differential circuit include NMOS transistors such that the first stage has an input common range from $V_{DD}/2$ to $V_{DD}$.

19. The memory device of claim 17, wherein each of the first differential circuit and the second differential circuit include PMOS transistors such that the first stage has an input common mode range from 0 to $V_{DD}/2$.

20. The memory device of claim 17, wherein one of the first differential circuit and the second differential circuit includes NMOS transistors and the other of the first differential circuit and the second differential circuit includes PMOS transistors such that the first stage has an input common mode range from 0 to $V_{DD}$.

21. The memory device of claim 17, wherein the first stage further comprises:
an averaging circuit configured to generate an averaged signal resulting from averaging the first differential internal signal and the second differential internal signal; and
a comparator operably coupled with the averaging circuit, the comparator configured to generate a bias signal in response to a comparison of the averaged signal and a reference signal corresponding to a switching point of the second stage, wherein the bias signal is used to drive bias transistors of the first differential circuit and the second differential circuit.

22. A method of buffering a signal, comprising:
receiving input signals at a plurality of oppositely electrically connected differential circuits of a first stage of a buffer; and
generating differential signals responsive to the received input signals, the differential signals having a common mode that is matched to a switching point of a second stage of the buffer.

23. The method of claim 22, further comprising generating complementary output signals at the second stage of the buffer.

24. The method of claim 22, further comprising generating a bias signal in a common mode feedback path in the first stage of the buffer.

25. The method of claim 24, wherein generating a bias signal in a common mode feedback path comprises:
averaging the differential signals to generate an averaged output signal;
generating a reference signal; and
comparing the averaged output signal with the reference signal to generate the bias signal.

* * * * *